United States Patent
Bouche et al.

(10) Patent No.: US 10,236,350 B2
(45) Date of Patent: Mar. 19, 2019

(54) METHOD, APPARATUS AND SYSTEM FOR A HIGH DENSITY MIDDLE OF LINE FLOW

(71) Applicant: GLOBALFOUNDRIES INC., Grand Cayman (KY)

(72) Inventors: Guillaume Bouche, Albany, NY (US); Tuhin Guha Neogi, Fishkill, NY (US); Sudharshanan Raghunathan, Santa Clara, CA (US); Andy Chi-Hung Wei, Queensbury, NY (US); Jason Eugene Stephens, Hopewell Junction, NY (US); Vikrant Kumar Chauhan, Clifton Park, NY (US); David Michael Permana, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 57 days.

(21) Appl. No.: 15/067,540

(22) Filed: Mar. 11, 2016

(65) Prior Publication Data

US 2017/0263715 A1    Sep. 14, 2017

(51) Int. Cl.
| | |
|---|---|
| *H01L 29/40* | (2006.01) |
| *H01L 29/49* | (2006.01) |
| *H01L 29/66* | (2006.01) |
| *H01L 21/311* | (2006.01) |
| *H01L 21/02* | (2006.01) |
| *H01L 21/3105* | (2006.01) |
| *H01L 21/027* | (2006.01) |
| *H01L 21/768* | (2006.01) |

(52) U.S. Cl.
CPC ........ *H01L 29/401* (2013.01); *H01L 21/0273* (2013.01); *H01L 21/02126* (2013.01); *H01L 21/02164* (2013.01); *H01L 21/31055* (2013.01); *H01L 21/31111* (2013.01); *H01L 21/76897* (2013.01); *H01L 29/4966* (2013.01); *H01L 29/6653* (2013.01); *H01L 29/6656* (2013.01); *H01L 29/66795* (2013.01)

(58) Field of Classification Search
CPC ............. H01L 27/10826; H01L 29/785; H01L 27/10879

See application file for complete search history.

(56) References Cited

U.S. PATENT DOCUMENTS

| | | | |
|---|---|---|---|
| 2014/0264588 A1* | 9/2014 | Chen | ................... H01L 29/7816 257/343 |
| 2014/0306291 A1* | 10/2014 | Alptekin | ........... H01L 29/41725 257/369 |

* cited by examiner

*Primary Examiner* — Mohammad Choudhry
(74) *Attorney, Agent, or Firm* — Williams Morgan, P.C.

(57) ABSTRACT

At least one method, apparatus and system disclosed herein for forming a finFET device. A gate structure comprising a gate spacer on a semiconductor wafer is formed. A self-aligned contact (SAC) cap is formed over the gate structure. A TS structure is formed. At least one M0 metal structure void is formed. At least one CB structure void adjacent the M0 metal structure void is formed. An etch process is performed the M0 and CB structures voids to the gate structure. At least one CA structure void adjacent the CB structure void is formed. The M0, CB, and CA structure voids are metallized.

19 Claims, 15 Drawing Sheets

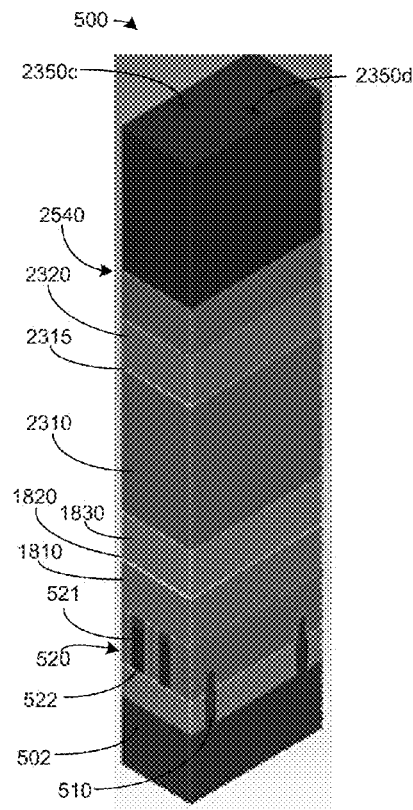
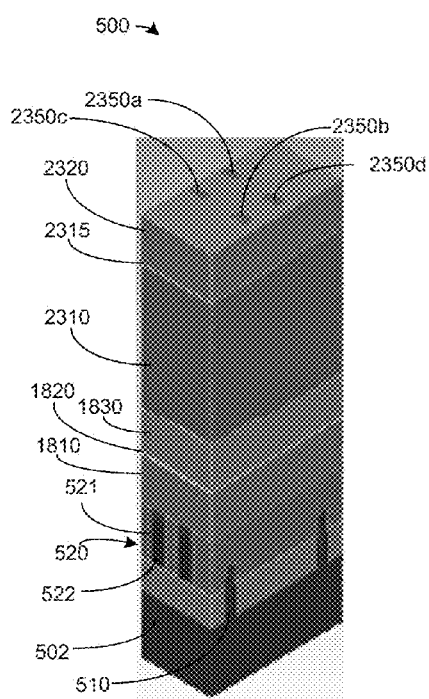
Fig. 25
Fig. 26
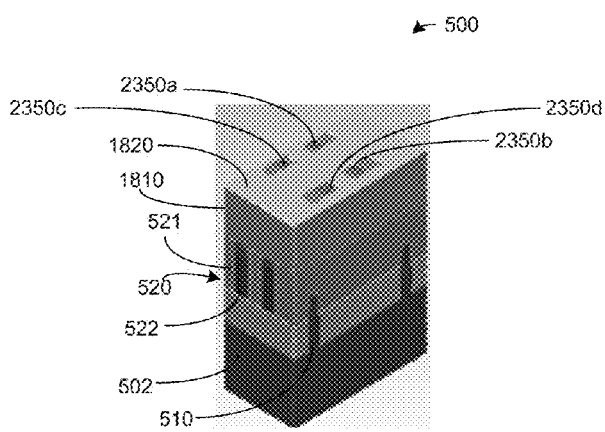
Fig. 27

METHOD, APPARATUS AND SYSTEM FOR A HIGH DENSITY MIDDLE OF LINE FLOW

BACKGROUND OF THE INVENTION

Field of the Invention

Generally, the present disclosure relates to the manufacture of sophisticated semiconductor devices, and, more specifically, to various middle of line (MOL) flow for fabricating high density finFET devices having cross couple.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be positioned to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increased drive current capabilities.

Designers are constantly attempting to increase the density of integrated circuits by decreasing the size of features on semiconductor devices. As a result, there is challenge to create standard functional cell library logic devices, such as scan-D flip-flops and multiplexers to accommodate the smaller devices. This is particularly the case at the 10 nm node, where lithographic limitations can result in a lack of scaling of standard cell library devices. One solution attempted by designers is to perform cross coupling of transistors for providing standard cell library devices. Cross coupling and logic scaling provides for utilizing lower amount of area of the semiconductor device, in an attempt to overcome undesirable properties, such as larger semiconductor device or less functionality in the semiconductor device.

As finFET devices become more dense (e.g., 10 nm technology), the tracks (i.e., metal pitch) become smaller. This raises many issues, such as processing accurately at 7.5 nm track spaces. In a 7.5T design, in a standard cell, at 42 nm spacing per track, only 315 nm are generally available. Generally 42 nm is typically selected as a limit to allow for printing using Self-Aligned Double Patterning (SADP) at various sizes, as would be required for Static Random Access Memory (SRAM) Metal 2 Word Lines (M2 WL) and potential sizing usage in logic routing levels.

Accordingly, roughly 90-95 nm Power Rail (PR) width and 215 nm space would be available for the designers to perform placing and routing. One of the more critical parts of the design may be processing the M0 metal Tip to Tip (T2T)—as in controlling precisely during manufacturing the end-to-end spacing between two Metal 0 line segments—and the CB enclosure by M0 with CB the metal via electrically connecting M0 to the top of the gate. The industry lacks an effective method of providing a design that comprises cross coupling and a first level metal needed to finish a standard cell, wherein the first level metal can be used as the routing level.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a finFET device. A gate structure comprising a gate spacer on a semiconductor wafer is formed. A self-aligned contact (SAC) cap is formed over the gate structure. A Trench-Silicide (TS) structure is formed. At least one M0 metal structure void is formed. At least one CB structure void adjacent the M0 metal structure void is formed. An etch process is performed that opens the M0 and CB structures voids to the gate structure. At least one CA structure void adjacent the CB structure void is formed. The M0, CB, and CA structure voids are metallized.

BRIEF DESCRIPTION OF THE DRAWINGS

The disclosure may be understood by reference to the following description taken in conjunction with the accompanying drawings, in which like reference numerals identify like elements, and in which:

FIGS. 23-27 illustrate stylized, isometric views of the device 500 with respect to performing a CB double patterning LELE process, in accordance with embodiments herein;

Figure 1:
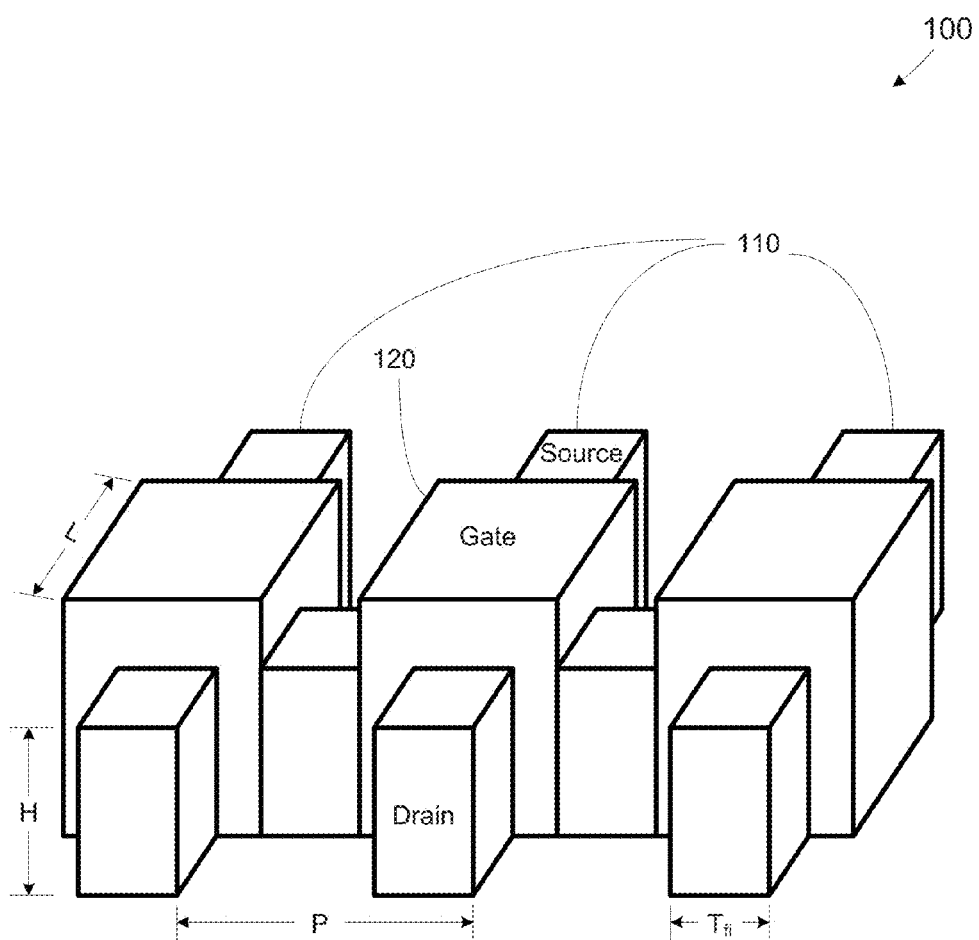
FIG. 1 illustrates a stylized cross-sectional depiction of a state-of-the-art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figs. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a 10 nm architecture that is capable of providing 31.5 nm fin pitch in a 7.5 nm track design at 42 nm metal (Mx, wherein x=0, 1, 2, 3, . . . ) pitch for processing cross couple. Embodiments herein provide for a self-aligned to gate borderless TS, as well as a self-aligned to gate local interconnect structure (i.e., CA structure). In embodiments herein, another local interconnect structure (i.e., CB structure) may be self-aligned, to the M0 line above. The design provided by embodiments herein provides for obviating the need for V0 (via) because the M0 of embodiments herein is designed to land directly on CB. Further, M0 may be unidirectional, wherein the M1 of previous designs is replaced by the M0. Further, the M2 of previous designs may be replaced by M1. Embodiments herein provide for a six mask middle of line (MOL) process, wherein the first level metal is not needed to finish a standard cell. That is, the first level metal may be used as the routing level.

Although not limited to specific embodiments disclosed in the present disclosure, exemplary embodiments herein provide for processing a semiconductor wafer for forming a device comprising a plurality of fins having 31.5 nm in a horizontal configuration in a 10 nm architecture. Further, the device may comprise vertical gates with contacted poly pitch (CPP) of 63 nm using LELE processing. The vertical M0 metal structure may be of 42 nm LELE with LELE CB vias and tabs on active structures.

The device of embodiments herein may also comprise horizontal CA structures formed using LELE processing, wherein the CA structures may be in the form of bars and/or vias. The M1 metal lines of the structures may be horizontally formed using 42 nm self-aligning double patterning (SADP) processing utilizing two blocks or cut masks. The M2 metal lines of the device may be may be vertically formed using 42 nm SADP processing utilizing one cut mask. The M3 metal lines of the device may be may be horizontally formed using 42 nm SADP processing utilizing one cut mask. In one embodiment, 42 nm measurement is selected as a limit to allow for printing SADP at various sizes required to form SRAM M2 word lines. Further, the 42 nm measurement may be utilized for potential sizing usage in logic routing levels.

Figure 2:
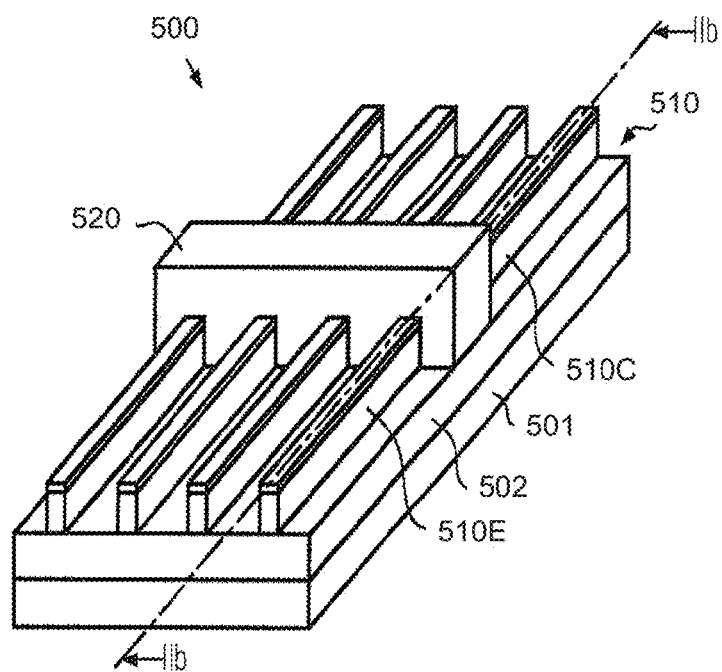
FIGS. 2-6 illustrate various stylized diagrams relating to forming a finFET device, in accordance with embodiments herein.

FIGS. 2-6 illustrate various stylized diagrams relating to forming a finFET device, in accordance with embodiments herein. FIG. 2 schematically illustrates a perspective view of a semiconductor device 500, which may also be referred to as multiple gate transistor, since at least two separate channel regions may be controlled by respective portions of a gate electrode. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon on insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 2), while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

Figure 3:
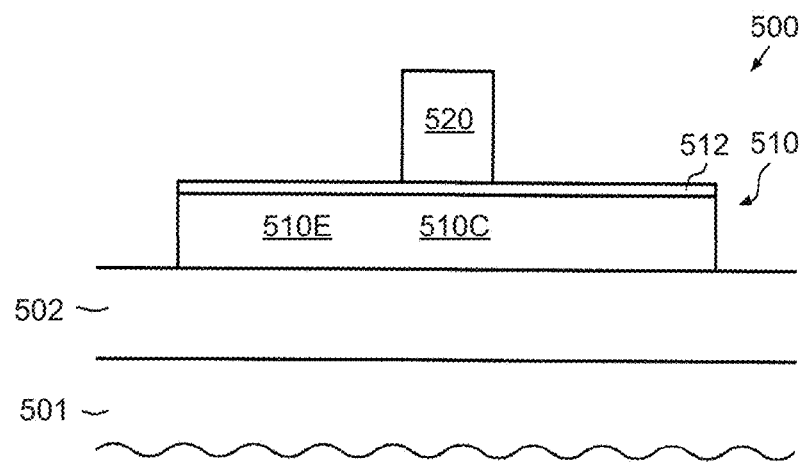

FIG. 3 illustrates a stylized depiction of a cross-sectional view taken along the section IIb of FIG. 2. As illustrated, a cap layer 512, such as a silicon oxide layer or a high-K HfO2 layer, and/or the like, may be formed on the fins 510, and under the gate electrode structure 520. The gate electrode structure 520 may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 3). The semiconductor device 500 as shown in FIGS. 5 and 6 may be formed on the basis of well-established process techniques as are, for instance, also explained above with reference to the device 100.

Figure 4:
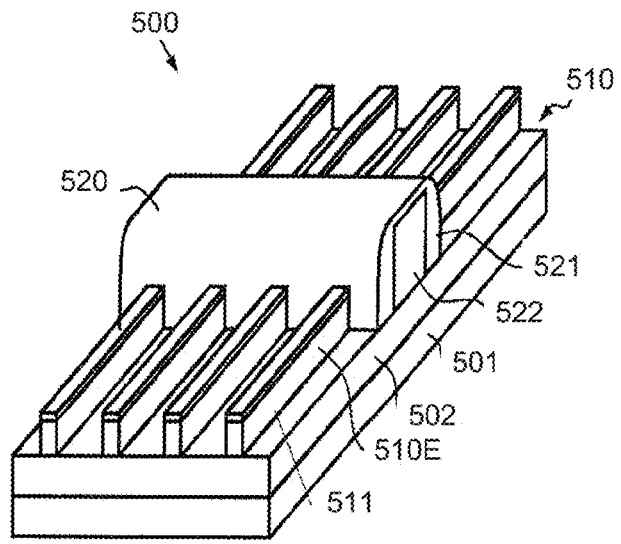

FIG. 4 illustrates a stylized depiction of a perspective view of the transistor 500 in a further advanced manufacturing stage. As illustrated, the gate electrode structure 520 may comprise a sidewall spacer structure 521, which may be comprised of any appropriate material such as silicon nitride, silicon dioxide and the like. The spacer structure may be formed on the basis of well-established deposition and etch techniques, wherein a width of the spacer structure 520 may be selected in accordance with a desired dopant profile in each of the end portions 510E of the Fins 510. That is, moderately high dopant concentration may be established in the end portions 510E adjacent to the gate electrode structure 520, possibly by using an offset spacer element (not shown) and thereafter one or more spacer elements of the structure 521 may be provided and may be used as an implantation mask during one or more subsequent implantation steps to provide the desired high dopant concentration in the end portions 510E with a lateral distance to a gate electrode material 522 of the gate electrode structure 520. It should be appreciated that any appropriate concentration profile extending from the electrode material 522 may be established by appropriately forming a corresponding number of spacer elements in the structure 521. It should further be appreciated that any other implantation processes may be performed, for instance with respect to defining a counter doped area in the vicinity of the central portion 510C, which represents the actual channel region. Drain and source regions 511 may be formed at oppositely positioned end portions 510E having the desired dopant concentration and concentration gradient with respect to the central portion 510C.

Figure 5:
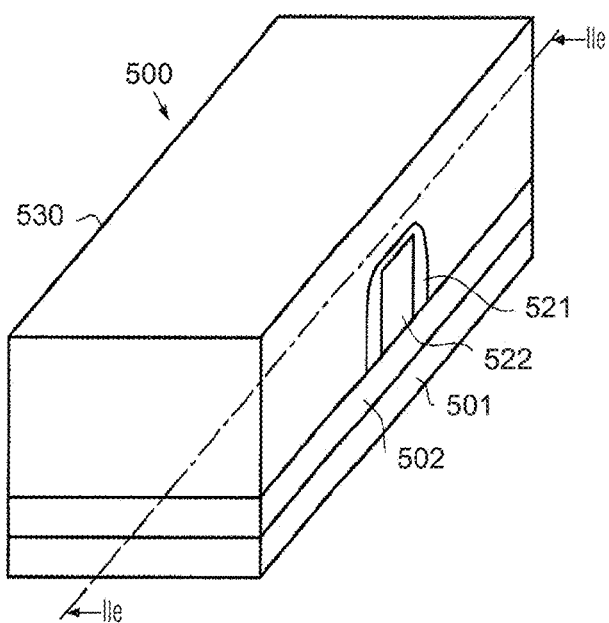

FIG. 5 illustrates a stylized depiction of the semiconductor device 500 in a further advanced manufacturing stage. As illustrated, a dielectric material 530, such as silicon dioxide, silicon nitride, silicon carbide and the like, may be formed above the fins 510 and the gate electrode structure 520. The dielectric material 530 may, in some illustrative embodiments, be comprised of two or more material layers in order to adapt the material characteristics to the further processing of the device 500. For instance, an etch stop liner may be formed and thereafter the actual fill material may be deposited having the desired material characteristics. In other illustrative embodiments, appropriate anti-reflective coating (ARC) materials, hard mask materials and the like may be provided, at least in an upper portion of the dielectric material 530. The deposition of the material 530 may be accomplished on the basis of well-established deposition techniques, such as plasma enhanced chemical vapor deposition (CVD), thermally activated CVD, spin-on techniques, depending on the material characteristics required. For example, materials of reduced relative permittivity may be selected if an increased fringing capacitance or any other parasitic capacitance with respect to additional wiring levels to be formed above the device 500 are considered inappropriate.

Figure 6:
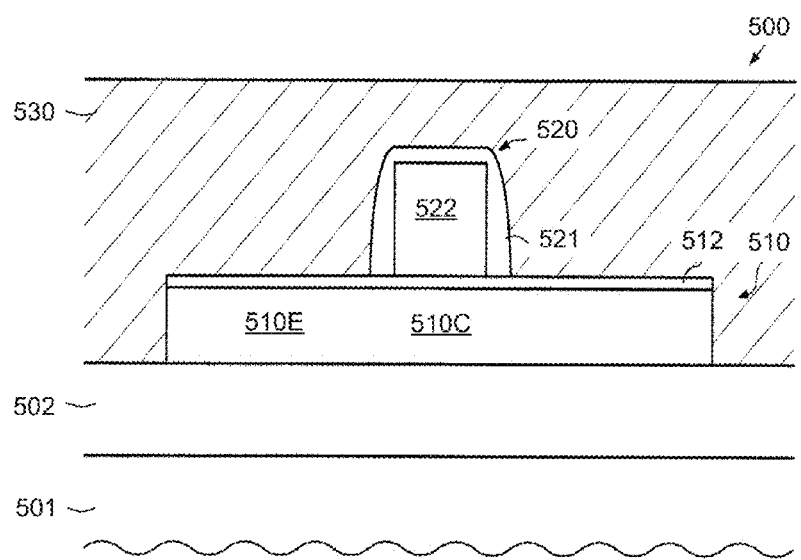

FIG. 6 illustrates a stylized depiction of a cross-sectional view of the device 500 of FIG. 5. As illustrated, the material 530 may enclose the gate electrode structure 520 and the end portions 510E of the Fins 510. After the deposition of the dielectric material 530, a lithography process may be performed to provide an etch mask that defines the lateral position and size of corresponding openings to be formed in the dielectric material 530.

Figures 7, 8:
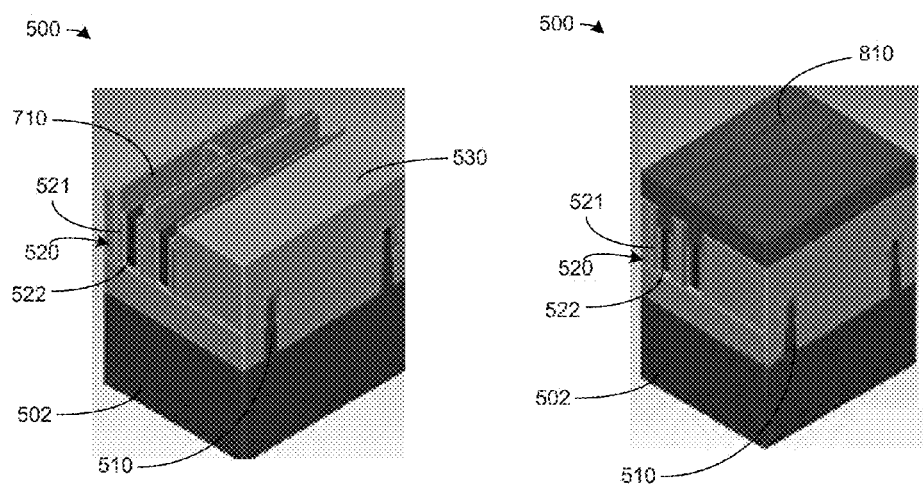
FIGS. 7-9 illustrate stylized depiction of a isometric views of the device 500 of FIG. 6 with respect performing a replacement metal gate process, in accordance with embodiments herein.
Figure 9:
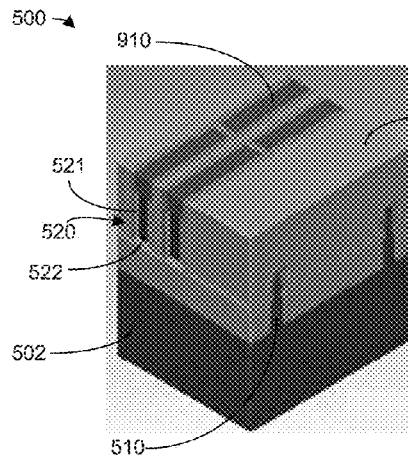

FIGS. 7-9 illustrate stylized depiction of isometric views of the device 500 of FIG. 6 with respect performing a replacement metal gate process, in accordance with embodiments herein. FIG. 7 illustrates device 500 comprising a plurality of gate structures 520 formed on a base layer 502 over a substrate. The gates 520 comprise gate metal structures 522 and gate spacers 521. FIG. 7 also illustrates a plurality of source/drain fins 510.

In one embodiment, the replaced metal gates are recessed by means of an etch. Also a partial SiOC isotropic etch process may be performed to remove the top portion of the gate spacer 521, leaving exposed an outer nitride sidewall from the liner 710 (FIG. 7). Upon performing this etch process, the gate spacer 521 material may be replaced by nitride by performing a nitride cap deposition process to form a gate nitrite cap layer 810 over the recessed gate (FIG. 8). Replacing the upper part of the gate spacer 521 material with nitride may reduce the risk of shorts to gate through the spacer at the top corner of the gate during CA oxide etch process. Subsequently, a chemical-mechanical polishing (CMP) process may be performed on the nitride cap layer 810 (FIG. 9). This results in a T-shaped self-aligned contact (SAC) cap 910.

Figure 10:
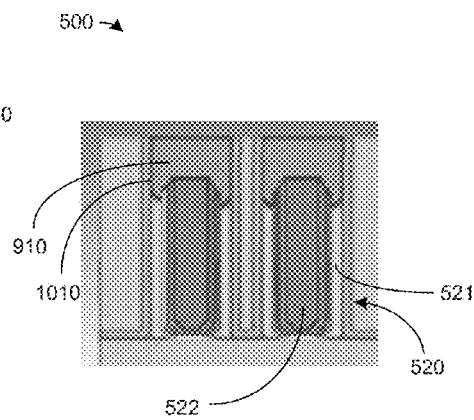
FIG. 10 illustrates a stylized cross-sectional view of the device 500 with respect to FIG. 9, in accordance with embodiments herein.

FIG. 10 illustrates a stylized, cross-sectional depiction of device 500 of FIG. 9, in accordance with embodiments herein. FIG. 10 illustrates the T-shaped cap 910 atop the gate electrode material 522. In some embodiments, the T-shaped cap 910 provides for a reduction in process errors. FIG. 10 also illustrates a poly open CMP (POC) liner 1020.

Figure 11:
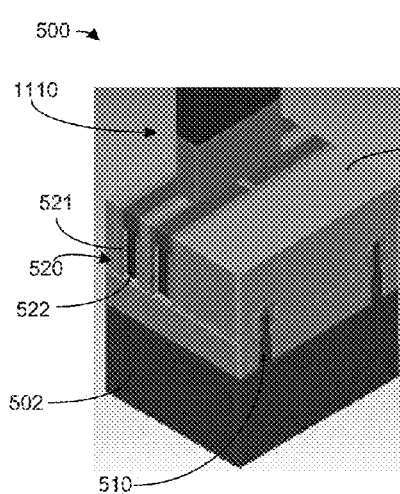
FIGS. 11-17 illustrate stylized, isometric views of the device 500 with respect to performing a borderless TS processing, in accordance with embodiments herein.

FIGS. 11-17 illustrate stylized, isometric views of the device 500 with respect to performing a borderless TS processing, in accordance with embodiments herein. Subsequent to forming a T-shaped cap 910, a borderless TS processing flow may be performed. A lithography stack 1110 may be formed, as shown in FIG. 11. The lithography stack 1110 may be comprised of various materials, such as photoresist and molecular layer deposition (MLD)—$Si_3N_4$ materials. In one embodiment, the scheme illustrated in FIGS. 11 to 17 is for a replacement contact integration scheme, for which the dielectric area over the contacts is initially preserved with a lithographic stack during a RIE etch, better to be removed later on in the flow with a highly selective etch process, overall providing a technique to lower the risk of gouging in active source and drain regions.

Figure 12:
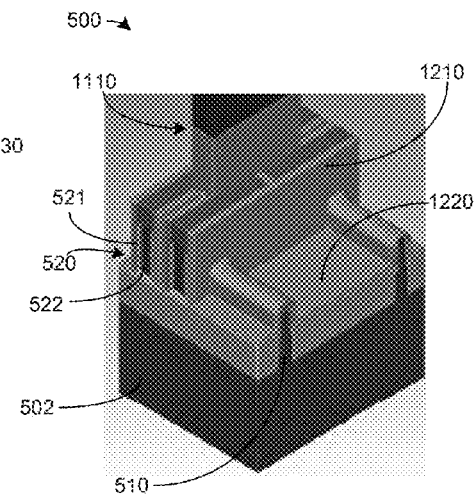
Figure 13:
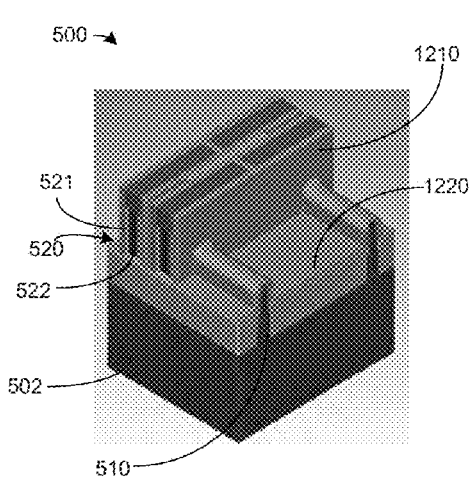
Figure 14:
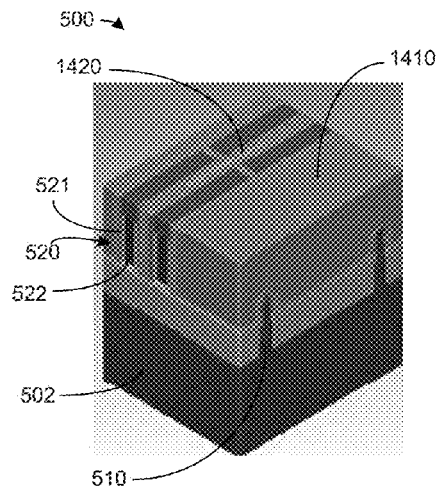

An etch oxide process may then be performed (FIG. 12). This process removes the dielectric material 530 (e.g., high-density plasma (HDP) oxide), which exposes the sidewall 1210 ($Si_3N_4$) and the nitride portion 1220. An organics stripping process may then be performed (FIG. 13), removing the lithography stack 1110. An SiOC deposition process followed by a CMP process may then be performed (FIG. 14), forming an SiOC layer 1410. This deposition process may comprise depositing carbon-rich $SiO_2$ for providing an $SiO_2$ layer 1420 where the dielectric 530 was previously located. This carbon-rich $SiO_2$ may provide for improved gap-fill properties and selectivity at etch versus undoped oxide as C is a well-known inhibitor during wet oxide removal.

Figure 15:
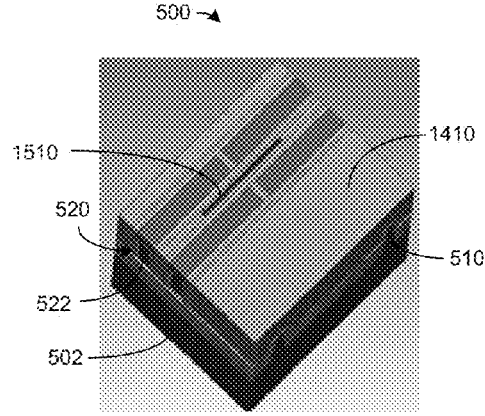

A wet etch $SiO_2$ diluted HF process may then be performed (FIG. 15). Since the SiOC deposition process involved carbon-rich $SiO_2$ layer 1420, the etch process of FIG. 15 etches away the $SiO_2$ portion 1420, while preserving the SiOC portion 1410. This results in a trench 1510. The wet etch process of FIG. 15 has substantially no impact on the source/drain fins 510.

Figure 16:
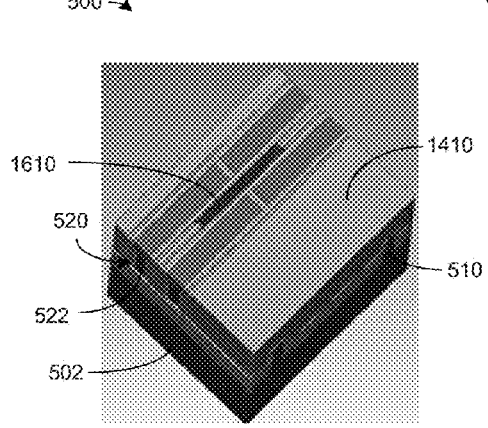

Subsequently, the POC liner etch, also referred to as contact etch stop layer (CESL) punch-process, is performed to remove the sidewalls of the trench 1510, resulting in a larger trench 1610 (FIG. 16). This process involves a controlled nitride removal process, i.e., an isotropic etch process that is a dry process. This process generally etches approximately 5 nm of nitride to remove the sidewalls, so the trench void 1610 is wider. This process also removes the nitride at the bottom of the trench 1610, exposing the source/drain fins 510 in view of contacting.

Figure 17:
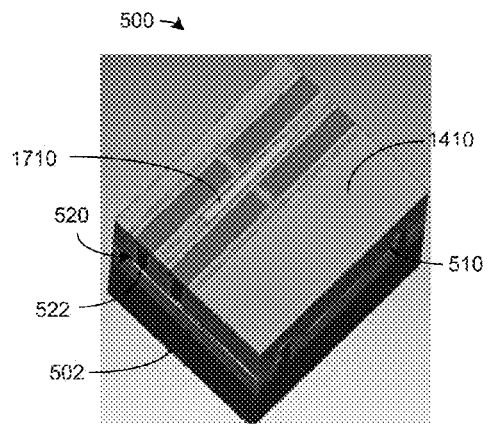

Subsequently, the trench 1610 is metallized (FIG. 17). This metallization process may involve depositing a metal liner (e.g., titanium-nitride ["Ti-Nitride" or "TiN"] over a thin Ti film), followed by filling with tungsten. In some embodiments, cobalt can also be used for contact metal instead of tungsten. This process also includes performing a CMP process, which results in a borderless TS structure 1710. The term borderless in one embodiment, may refer to a lithography stack 1110 that was overlapping the gate, but ultimately processing makes the TS structure 1710 self-aligned to the gates, wherein the TS region is filled in to its dimensions. The borderless TS process described in FIGS. 11-17 overcomes the difficulty of etching contacts in state of the art processes, wherein some etching processes in the past would leave oxide residue, or cause over-etching, which would damage source/drains regions. Embodiments described herein reduce these problems.

Figure 18:
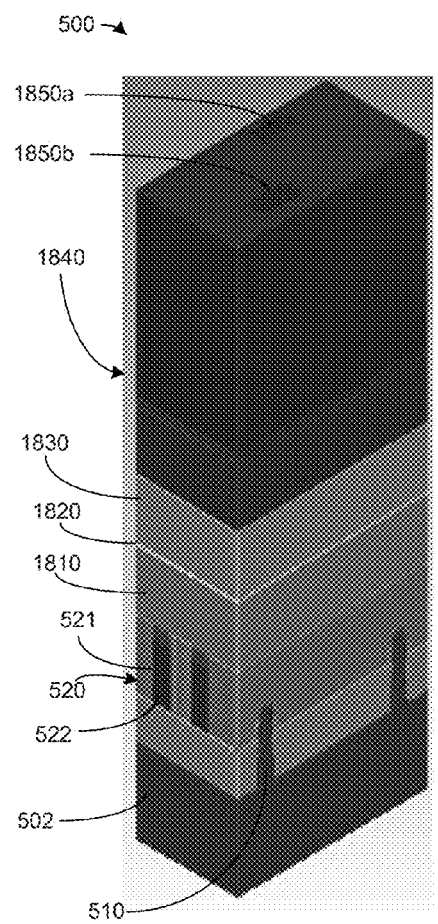
FIGS. 18-22 illustrate stylized, isometric views of the device 500 with respect to performing a M0 double patterning using a succession of Litho, Etch, Litho, Etch (LELE) process, in accordance with embodiments herein.

FIGS. 18-22 illustrate stylized, isometric views of the device 500 with respect to performing a M0 double patterning LELE process in accordance with embodiments herein. The process illustrated in FIGS. 18-22 provides M0 structure trenches or voids, which may be filled/metallized at a later step. As shown in FIG. 18, a dielectric layer 1810 (e.g., PECVD oxide layer) is deposited. A thin layer of Ti-Nitride material 1820 is subsequently added. An oxide memorization layer 1830 is formed over the thin Ti-Nitride layer 1820 to record both of the two patterns during the LELE process. Subsequently a lithography stack 1840 is deposited. The M0 patterns 1850a and 1850b are formed on the lithography stack 1840. The lithography stack 1840 may be comprised of various materials, such as photoresist, bottom anti reflective coating (BARC), organic planarization layer (OPL) material, and $Si_xON_y$ materials. The patterns 1850a and 1850b may be sufficiently spaced apart one to the other such that the capability of the lithographic process allows to print them with the same exposure.

Figure 19:
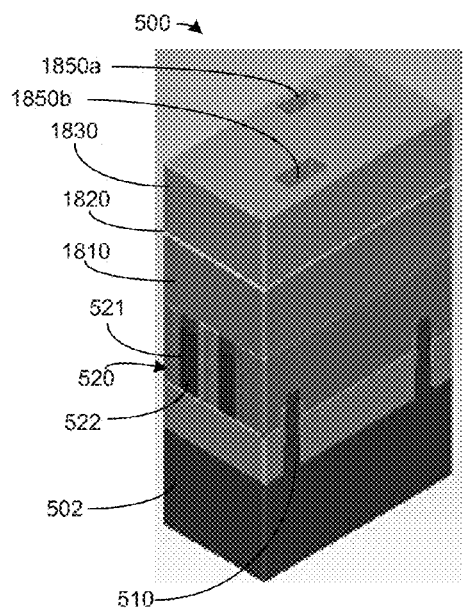
Figure 20:
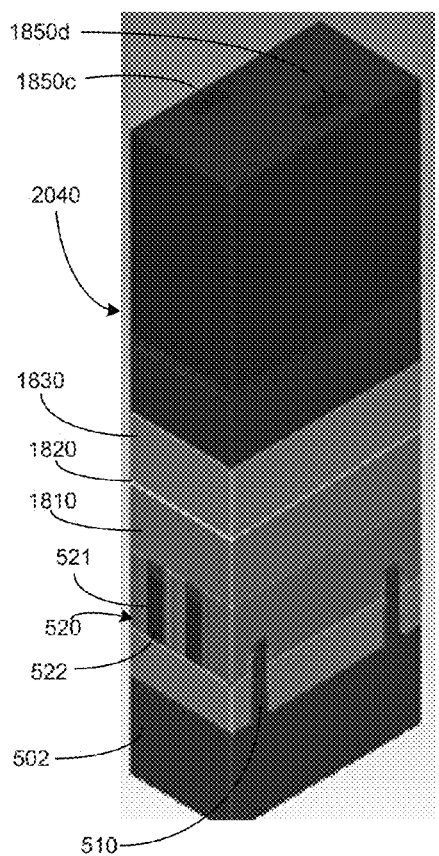

The lithography stack 1840 is then etched, wherein the M0 patterns 1850a, 1850b are "memorized" into the oxide layer 1830 (FIG. 19). The second part of the double patterning is then performed. Another lithography stack 2040 is deposited on the patterned oxide layer 1830 (FIG. 20). The lithography stack 2040 may be comprised of various materials, such as photoresist bottom anti reflective coating (BARC), organic planarization layer (OPL) material, and $Si_xON_y$ materials. The M0 patterns 1850c and 1850d are formed on the lithography stack 2040.

Figure 21:
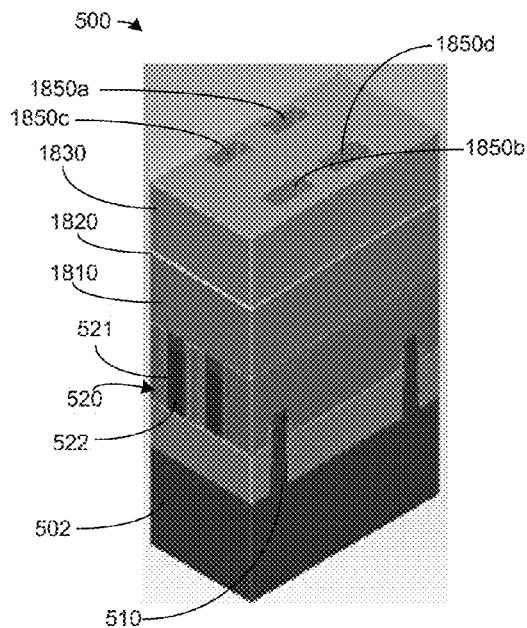
Figure 22:
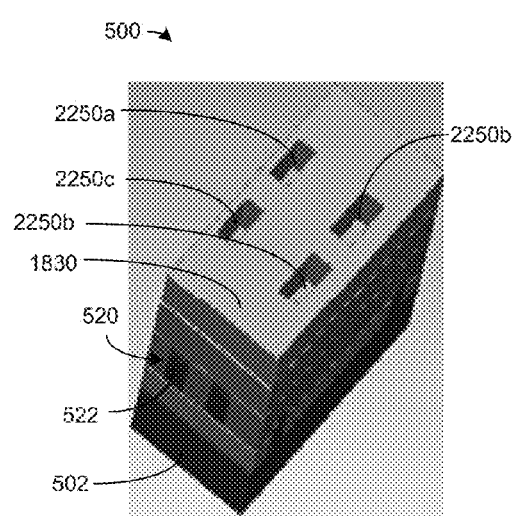

The lithography stack 2040 is then etched, wherein the M0 patterns 1850c and 1850d are also memorized into the oxide layer 1830 (FIG. 21). The Ti-Nitride 1820 acts as an etch stop layer. Therefore, at this point, M0 patterns 1850a, 1850b, 1850c, and 1850d are all memorized into the oxide layer 1830. Note that in the past, printing all four patterns 1850a, 1850b, 1850c and 1850d at once was beyond the capability of optical immersion lithography, hence generating the need for the time consuming LELE sequence. Subsequently, a Ti-Nitride etch process is performed on the M0 patterns 1850a-d, to punch through the thin etch stop layer 1820, and form the M0 trenches 2250a-d, which goes down to the exposed dielectric layer 1810 at the bottom of the M0 trenches (FIG. 22).

Figure 23:
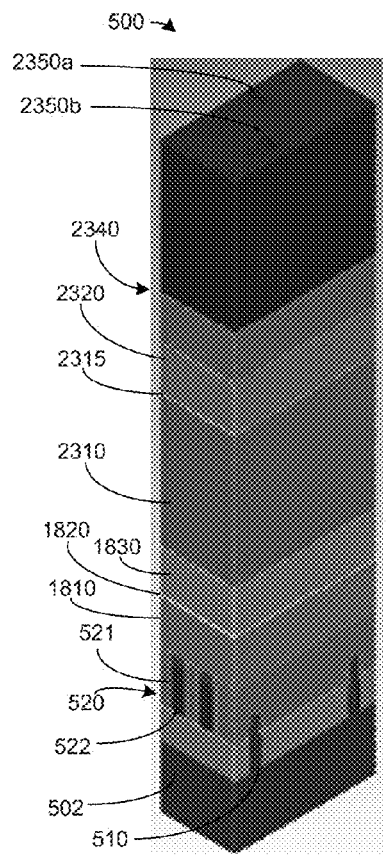

FIGS. 23-27 illustrate stylized, isometric views of the device 500 with respect to performing a CB double patterning LELE process, in accordance with embodiments herein. The process illustrated in FIGS. 23-27 provides CB structure voids or via cavities, which may be filled/metallized at a later step. As shown in FIG. 23, an organic planarization layer 2310 is deposited, the chemical composition of which may be mostly amorphous carbon. A thin, etch stop layer 2315 (e.g., SiON) layer is deposited. Subsequently, an oxide memorization layer 2320 is formed over the etch stop layer 2315 for performing memorization. Subsequently, a lithography stack 2340 is deposited. The CB patterns 2350a and 2350b are formed on the lithography stack 2340. The lithography stack 2340 may be comprised of various materials, such as photoresist and amorphous carbon materials.

Figure 24:
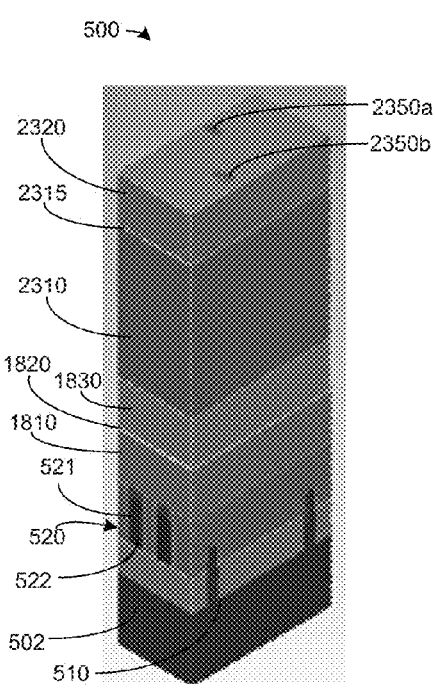

The lithography stack 2340 is then etched, wherein the CB patterns 2350a, 2350b are "memorized" into the memorization layer 2320 (FIG. 24). The second part of the double patterning is then performed. Another lithography stack 2540 is deposited on the patterned memorization layer 2320 (FIG. 25). The lithography stack 2540 may be comprised of various materials, such as photoresist and organic planarizing layer materials. The CB patterns 2350c and 2350d are formed on the lithography stack 2540.

The lithography stack 2540 is then etched, wherein the CB patterns 2350c and 2350d are also memorized into the oxide layer 2340 (FIG. 26). Therefore, at this point, CB patterns 2350a, 2350b, 2350c, and 2350d are all memorized into the memorization layer 2320 in accordance with the LELE process. Note that the LELE was chosen for CB for the similar reason it has been for M0 earlier in the flow: optical immersion lithography faces limitation in terms of resolution that, pending the advent of EUV lithography, has generated the need for multi-patterning within a single layer for the most advanced logic technologies. The CB patterns are all printed into the oxide layer 2320 and a SiON etch process is performed to bring down the CB patterns 2350a-d down through the etch stop layer 2315, then through the organic layer 2310 and down into the oxide layer 1830.

The oxide layer 2320, the etch stop layer 2315 are both etched away during the CB patterning. The dielectric etch is pursued that presents selectivity to Ti-Nitride. As a result, the Ti-Nitride layer 1820 is at a point exposed within the CB openings into the organic layer 2310, acts as a block to the etch while the CB via gets further etched into dielectric layer 1810 through the pre-existing M0 openings into Ti-Nitride. The organic layer 2310 gets in turn fully etched away (FIG. 27). As shown in FIG. 27, the CB patterns 2350a-d are resized and self-aligned within the M0 patterns 1850a-d. In this manner the CB structures formed from the CB patterns 2350a-d are merged with M0 structures formed from the M0 patterns 1850a-d.

Figure 28:
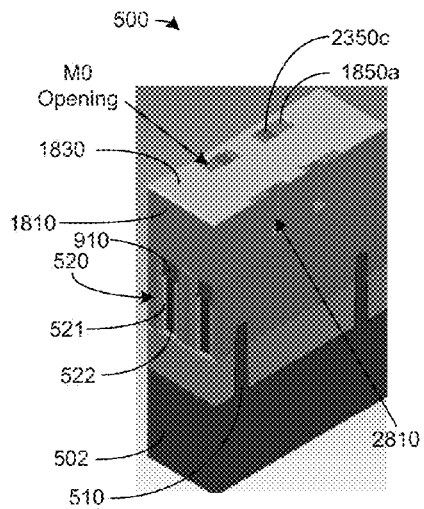
FIGS. 28-32 illustrate stylized, isometric views of the device 500 with respect to performing a formation of the CB/M0 structures, in accordance with embodiments herein.
Figure 29:
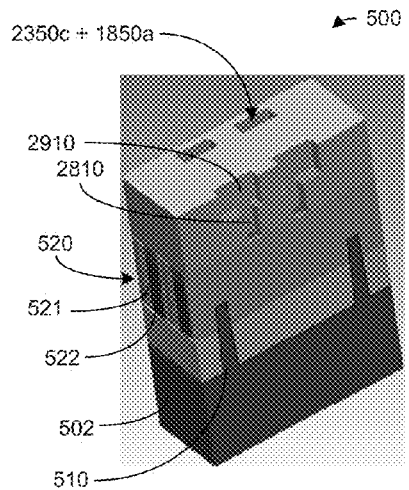

FIGS. 28-32 illustrate stylized, isometric views of the device 500 with respect to performing a formation of the CB/M0 structures, in accordance with embodiments herein and known as a dual-damascene patterning. The process illustrated in FIGS. 28-32 provides CB/M0 structure voids, which may be filled at a later step. FIG. 28 depicts a cross-section view of the structure of FIG. 27 and illustrates a CB trench within the M0 formations with the arrow labeled 2810. FIG. 28 also illustrates the M0 opening 1850a and the CB opening 2350c. A partial oxide etch process may be performed to complete CB trenches 2310 etch down to the gate nitride caps within the M0 formations 1850a-d forming M0 trenches 2910 by the same token (FIG. 29) bounded by the openings in the Ti-Nitride hard mask 1830.

Figure 30:
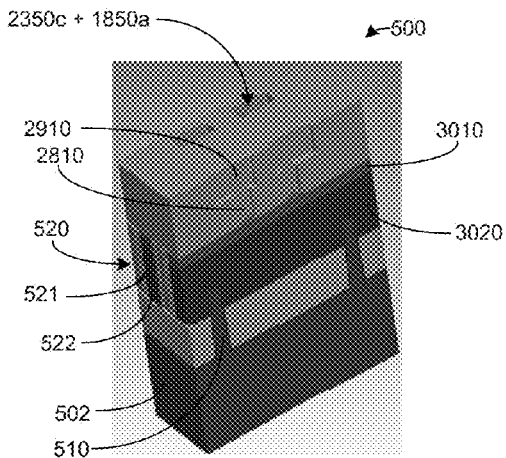
Figure 31:
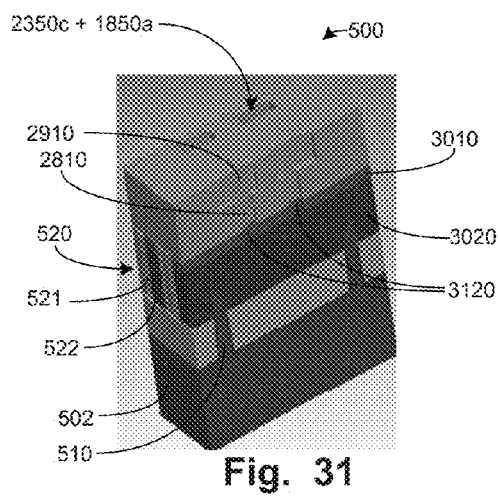
Figure 32:
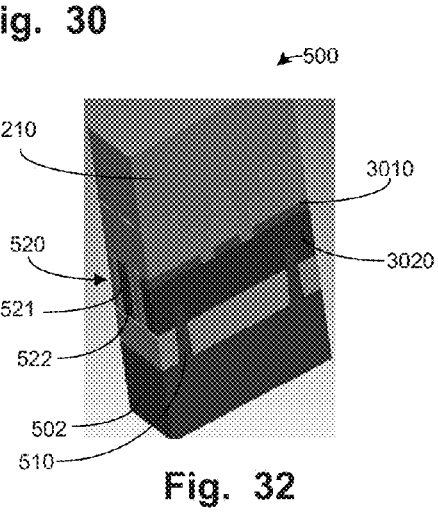

A Ti-Nitride stripping process may be performed to remove the Ti-Nitride layer 1830 (FIG. 30). This process may include performing a nitride etch. FIG. 30 also illustrates a gate cap layer 3010 (e.g., nitride cap) over the gate metal 3020. Subsequently, a punch gate cap etch process may be performed to form gate cap recesses 3120 (FIG. 31). Subsequently, a sacrificial light-absorbing organic mix layer 3210 (e.g., "DUO™" material) that behaves similar to an oxide layer during Reactive Ion (dry) Etching but is easier to etch away (using wet strip with dilute HF) is deposited (FIG. 32). The organic mix layer 3210 may be deposited using a spin-on process. This material may be self-planarizing material.

Figure 33:
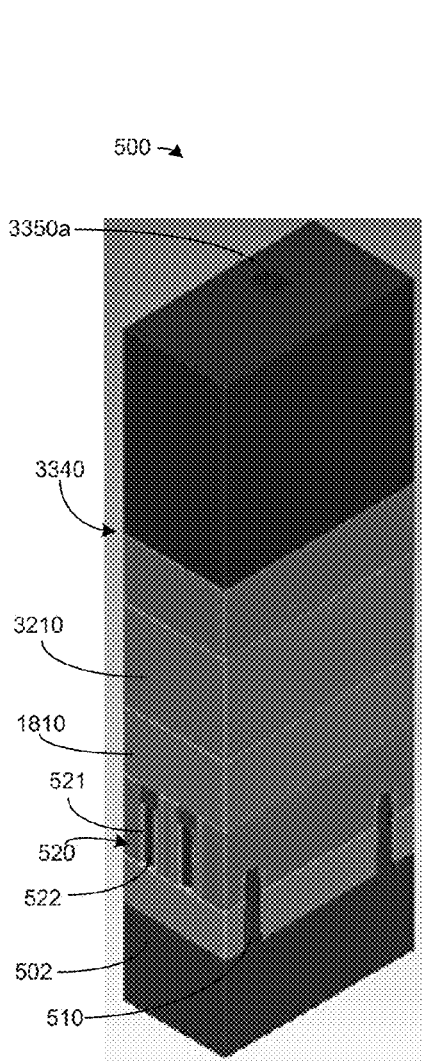
FIGS. 33-38 illustrate stylized, isometric views of the device 500 with respect to performing a CA double patterning process, in accordance with embodiments herein.
Figure 34:
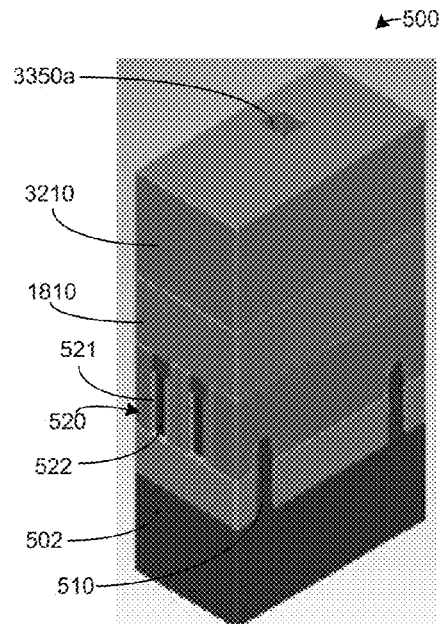

FIGS. 33-38 illustrate stylized, isometric views of the device 500 with respect to performing a CA double patterning process, in accordance with embodiments herein. As shown in FIG. 33, a lithography stack 3340 is deposited over the organic mix layer 3210. The process illustrated in FIGS. 33-38 provides CA structure voids, which may be filled at a later step. A CA pattern 3350a is formed on the lithography stack 3340. The lithography stack 3340 may be comprised of various materials, such as photoresist and organic planarizing layer materials, for instance an amorphous carbon film. The lithography stack 3340 is then dry etched, wherein the CA pattern 3350a formed into and through the organic mix layer 3210 (FIG. 34) and down into dielectric layer 1810 until reaching the top of TS. This CA oxide etch is selective to silicon nitride material, therefore, in the case when the T-shape gate nitride cap gets exposed during the CA patterning, the silicon nitride remains unaffected by the etch, providing further on dielectric isolation between CA vias and metal gates.

Figure 35:
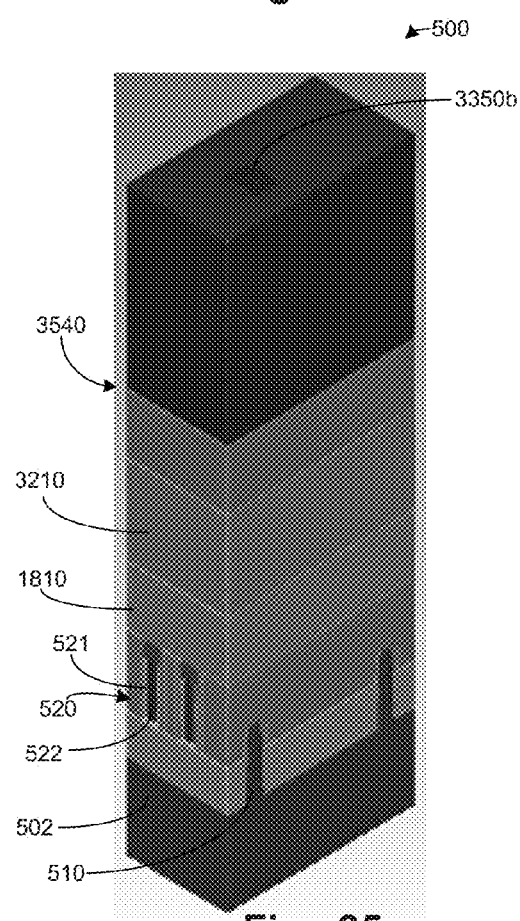

The second part of the CA double patterning is then performed. Another lithography stack 3540 is deposited on the patterned organic mix layer 3210 (FIG. 35). The lithography stack 3540 may be comprised of various materials, such as photoresist and organic planarizing layer material such as amorphous carbon. The CA pattern 3350b is formed on the lithography stack 3540.

Figure 36:
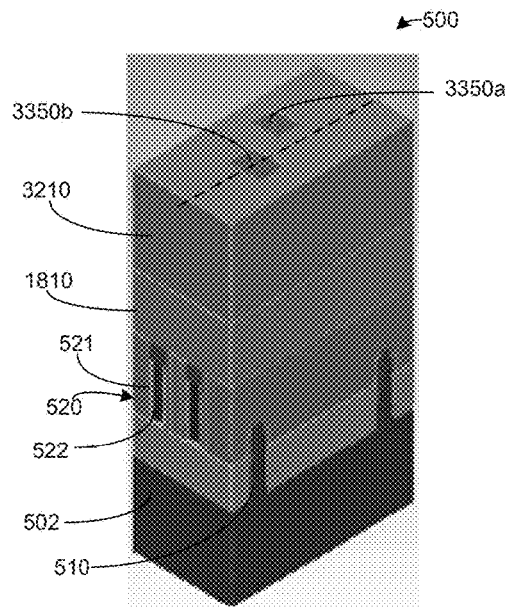
Figure 37:
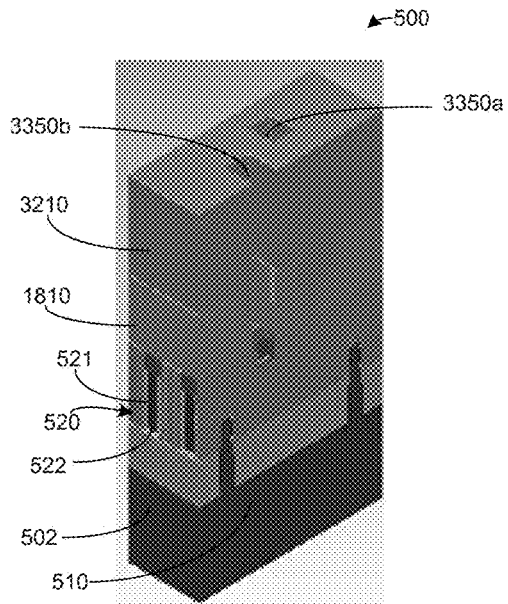

The lithography stack 3540 is then etched, wherein the CA pattern 3350b is formed into and through the organic mix layer 3210 (FIG. 36) and into the underlying dielectric layer 1810 until reaching TS. Therefore, at this point, CA patterns 3350a and 3350b are all formed into both the organic mix layer 3210 and the dielectric layer 1810. Those skilled in art having benefit of the present disclosure would appreciate that a memorization layer/process may be included in the CA formation process. The dotted line in FIG. 36 shows a reference point for the cross-sectional view presented in FIG. 37 illustrating the position of the CA voids down to the top of the TS so as to enable electrical contact between CA and TS further on.

Figure 38:
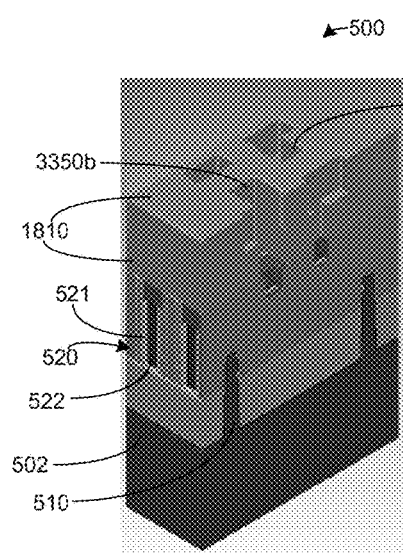

An etch process for removing the sacrificial organic mix layer 3210 (e.g., DUO™) is performed (FIG. 38). This etch process may involve performing a so-called "quick-ash" or "ashing" process. This process may be performed using $O_2$ or $N_2$ plasma, which removes the top surface material. It can be followed with a very dilute HF wet strip that will be mostly selective to all other materials present on the device at this level of dilution. At this point, the CA to TS may be merged with (or "stitched") to CB to gate PC. In alternative embodiments, CA and CB may not be stitched.

Figure 39:
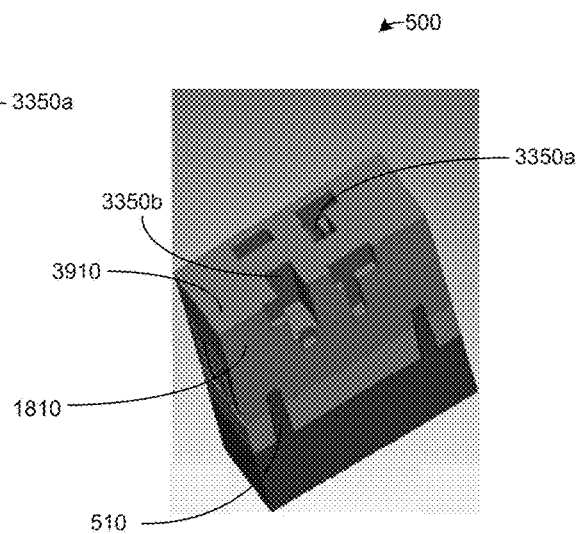
FIGS. 39-41 illustrate stylized, isometric views of the device 500 with respect to performing CA/CB/M0 fill and CMP process, in accordance with embodiments herein.
Figure 40:
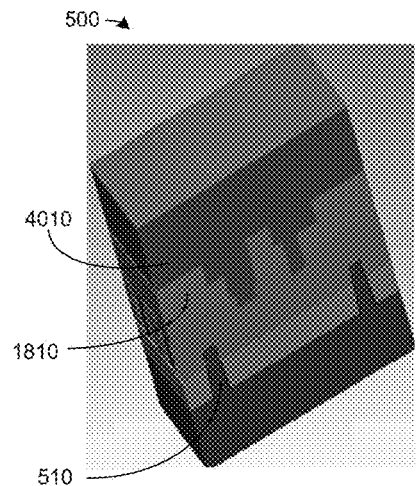
Figure 41:
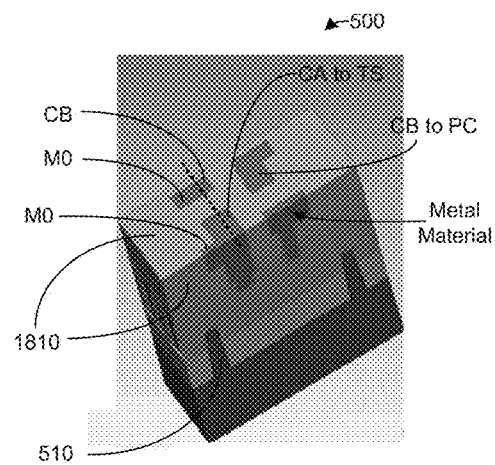

FIGS. 39-41 illustrate stylized, isometric views of the device 500 with respect to performing CA/CB/M0 fill and CMP process, in accordance with embodiments herein. A barrier of titanium nitride (TiN) or of tantalum nitride (TaN) layer 3910 may be deposited (FIG. 39). Subsequently, a metal layer 4010 may be deposited (FIG. 40). In one embodiment, a tungsten material is deposited. In other embodiments, cobalt or copper material may be deposited. A CMP process may be performed on the metal layer 4010 (FIG. 41). The M0, CB, CA to TS formations are illustrated in FIG. 41.

Figure 42:
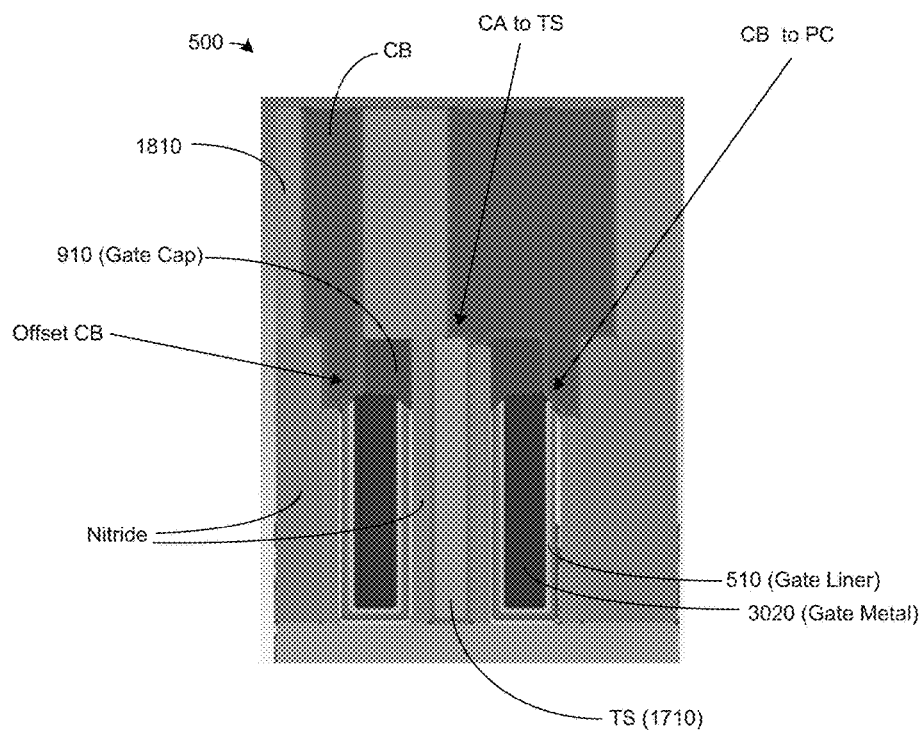
FIG. 42 illustrates a stylized cross-sectional view of the device 500 with respect to FIG. 41, in accordance with embodiments herein.

FIG. 42 illustrates a stylized cross-sectional of the device 500 with respect to FIG. 41, in accordance with embodiments herein. The cross-sectional view of FIG. 42 (see dotted line in FIG. 41 for reference) illustrates a plurality of gate metals 3020 encased by gate liners. Further, the gates are surrounded by SiOC spacer material then oxide materials except where metal TS contacts have been processed. The SAC gate cap 910 is located above the gate metals 3020.

The CB to PC formation is shown, wherein CB is offset from the metal gate 3020. The CA to TS formation is shown, wherein the CA formation is offset coupled to the TS formation 1710. Further, the CB formations are offset coupled to the gate metals 3020. The offset connections described above may provide for density, ability to pattern with a double-patterning scheme, and reduction in occurrence of short circuits or better yield. The processes described above provide for efficient cross-coupling of devices.

Figure 43:
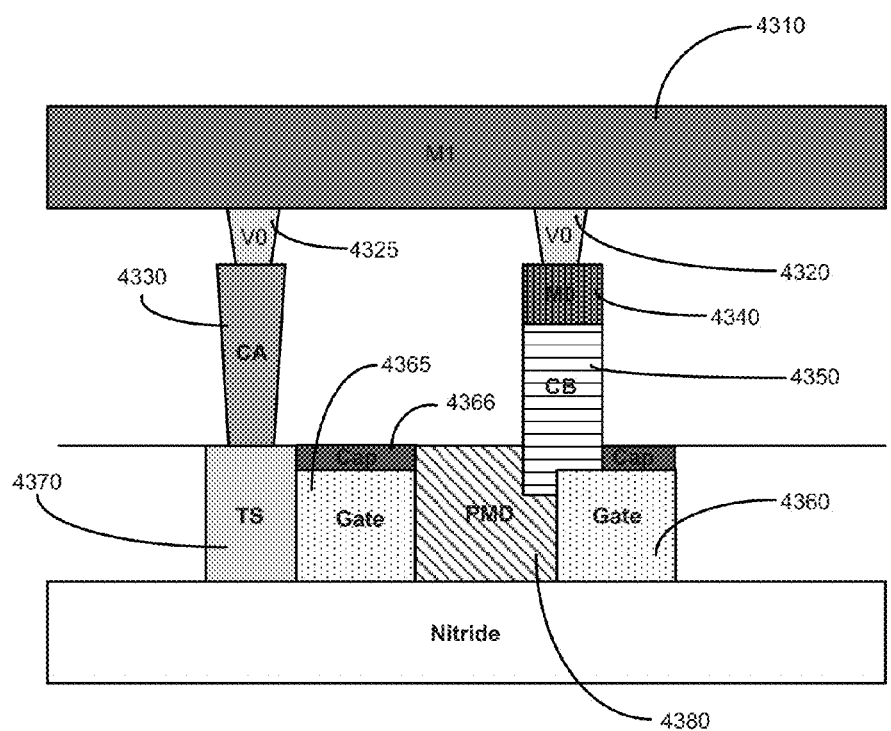
FIG. 43 illustrates a stylized cross-sectional view of one implementation of the device 500 of FIG. 41, in accordance with embodiments herein.

The processes above may be used to provide a cross coupled device exemplified by the stylized depiction provided in FIG. 43. A device may comprise an M1 metal layer 4310 that is coupled to a plurality of V0 vias 4320, 4325. The via 4320 is formed over the M0 metal layer 4340. The via 4325 is formed over a CA formation 4330. The CA formation 4330 is formed offset or not above a TS formation 4370. The TS 4370 is adjacent a gate 4365, which comprises a cap layer 4366. The cap layer may be a nitride layer. A CB formation 4350 is offset and coupled with respect to a gate 4360. A portion of CB 4350 is above a pre-metal dielectric material 4380, which is positioned between the gate 4360 and gate 4370. This exemplary architecture provides for a cross-couple design.

The CA/CB stitching provided by embodiments herein connects to TS, which in turn, connects to the gate. Since the same TS cannot be used for other CA/CB stitched pairs, offsetting may be employed. The CB connection is offset and CB connects to selected M0 and M1 structures. The M1 structure goes down to M0, and vice versa. The M1 structure here slides over the gate because it is not connected to the gate. The M1 structure goes down to M0, CB. The CB structure goes down to the gate.

Embodiments herein provide many advantages. For example, the gate T-shape cap described above on FIG. 10 provides extra-margin at CA patterning. This is because CA etch process is an oxide etch process selective to nitride. If the CA structure is misaligned, the etching process for CA will not provide for a connection to the gate metal. If the SiOC spacer is exposed at bottom portion of the CA structure, a risk of short to gate is present.

Other advantages of embodiments herein include the fact that the TS is borderless, thus, gate to contact shorts are reduced, while area of contact is increased. Further the top of the TS structure would be flush with the top of the gate cap. Further, since CB is self-aligned into M0, the PC pickup using CB structures is possible. Also, since the top of CA and M0 are flush, they are ready for pick up simultaneously by M1/V0.

Further advantages include the fact that TS pass-through is possible, which reduces the usage of C-shape M1 structures. This may improve yields since C-shape structures can cause process errors due to corner rounding and difficulties in controlling etch biases.

Embodiments provide for the possibility of CA/CB stitch. This can be used for landing V0 or to short gate to Source/Drain. Further, gate tie constructs to power rail and ground rails are made easier through M0 or CA/CB stitch. Also, CA flyover with respect to multiple gates is possible since CA is not borderless and the gates have protection from thick nitride caps.

Other advantages of embodiments herein include the fact that the CB connector construct may be formed using either long bar CB structures or long bar M0 structures. Further, using embodiments herein, a one-CPP (contacted polysilicon pitch) cross couple design is possible. Further, a TS pass-through may be also implemented.

Figure 44:
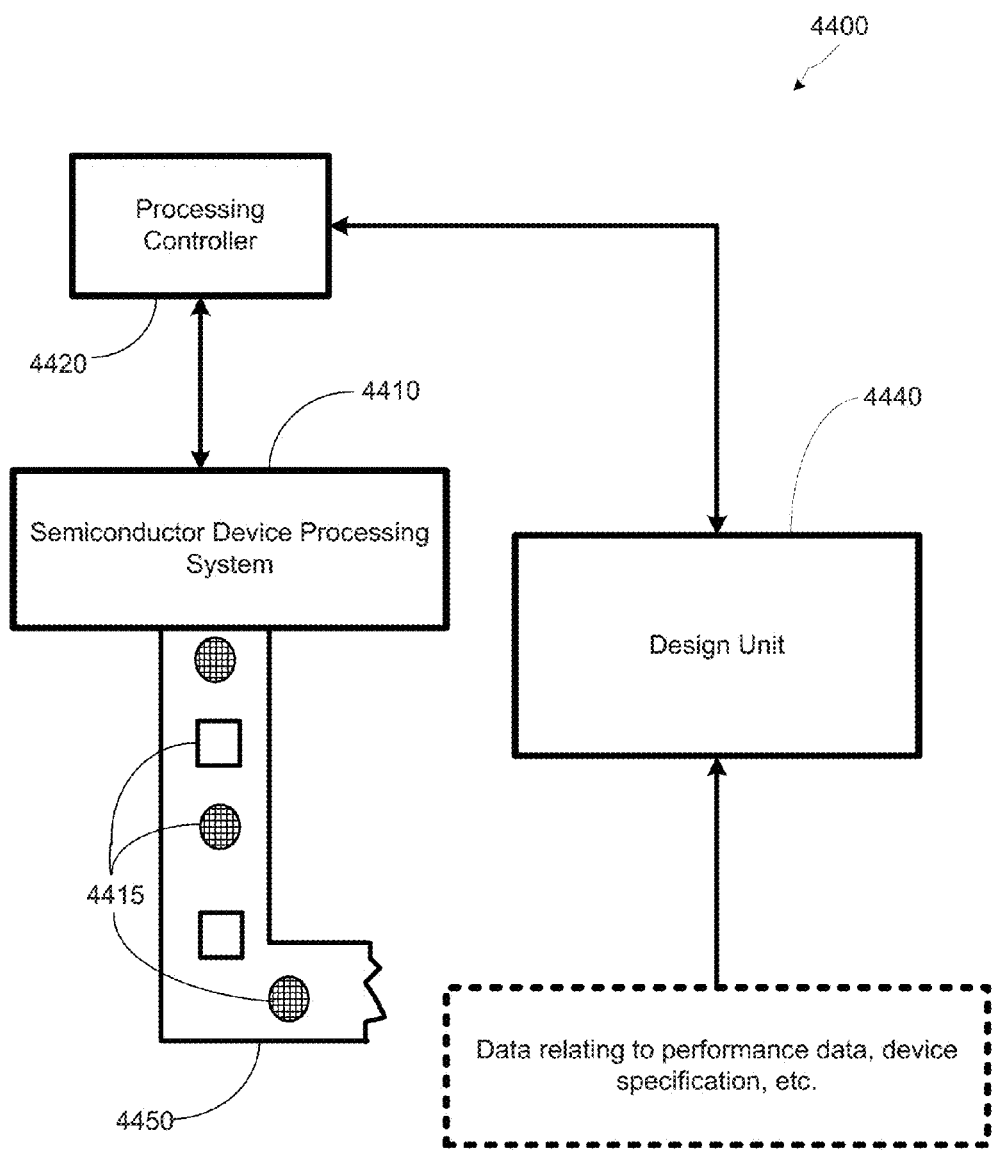
FIG. 44 illustrates a stylized depiction of a system for fabricating a semiconductor device package for forming finFET devices described herein, in accordance with embodiments herein.

Turning now to FIG. 44, a stylized depiction of a system for fabricating a semiconductor device package comprising cross couple design, in accordance with embodiments herein, is illustrated. The system 4400 of FIG. 44 may comprise a semiconductor device processing system 4410 and a design unit 4440. The semiconductor device processing system 4410 may manufacture integrated circuit devices based upon one or more designs provided by the design unit 4440.

The semiconductor device processing system 4410 may comprise various processing stations, such as etch process stations, photolithography process stations, CMP process stations, etc. One or more of the processing steps performed by the processing system 4410 may be controlled by the processing controller 4420. The processing controller 4420 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 4410 may produce integrated circuits on a medium, such as silicon wafers. More particularly, the semiconductor device processing system 4410 produce integrated circuits having finFET devices that comprise gate fins that have a rounded head and/or a neck as described above.

The production of integrated circuits by the device processing system 4410 may be based upon the circuit designs provided by the integrated circuits design unit 4440. The processing system 4410 may provide processed integrated circuits/devices 4415 on a transport mechanism 4450, such as a conveyor system. In some embodiments, the conveyor system may be sophisticated clean room transport systems that are capable of transporting semiconductor wafers. In one embodiment, the semiconductor device processing system 4410 may comprise a plurality of processing steps, e.g., the 1st process step, the 2nd process set, etc., as described above.

In some embodiments, the items labeled "4415" may represent individual wafers, and in other embodiments, the items 4415 may represent a group of semiconductor wafers, e.g., a "lot" of semiconductor wafers. The integrated circuit or device 4415 may be a transistor, a capacitor, a resistor, a memory cell, a processor, and/or the like. In one embodiment, the device 4415 is a transistor and the dielectric layer is a gate insulation layer for the transistor.

The integrated circuit design unit 4440 of the system 4400 is capable of providing a circuit design that may be manufactured by the semiconductor processing system 4410. The integrated circuit design unit 4440 may receive various types of data including performance data, device specification, etc. Using such data, the design unit 4440 may provide various process definitions based on the data that includes performance data, device specification, etc. Based upon such details of the devices, the integrated circuit design unit 4440 may determine specifications of the finFETs that are to be manufactured using the processes described above. Based upon these specifications, the integrated circuit design unit 4440 may provide data for manufacturing a semiconductor device package described herein.

The system 4400 may be capable of performing analysis and manufacturing of various products involving various technologies. For example, the system 4400 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for forming a finFET device, comprising:
   forming a gate structure comprising a gate spacer on a semiconductor wafer;
   forming a self-aligned contact (SAC) cap over said gate structure;
   forming a trench silicide (TS) structure;
   forming at least one first (M0) metal structure void;
   forming at least one first contact (CB) structure void adjacent said M0 metal structure void;
   etching below said M0 and CB structures voids to the gate structure;
   forming at least one second contact (CA) structure void adjacent said CB structure void; and
   metallizing said M0, CB, and CA structure voids;
   wherein forming said TS structure comprises:
      depositing a lithography stack in the location for said TS structure;
      performing an etch process for removing an SiO2 oxide portion and exposing a sidewall of said gate structure;
      removing said lithography stack;
      depositing an SiOC material on said location for said TS structure;
      performing a CMP process over said SiOC material;
      performing an etch process for removing SiO$_2$ material selective to said SiOC material;
      performing an etch process on said location for said TS structure for forming a TS structure void;
      removing sidewall and bottom material from said TS structure void; and
      performing a metallization process to form said TS structure.

2. The method of claim 1, wherein forming said SAC cap over said gate structure comprises forming a T-shaped SAC cap over said gate structure, comprising: removing a top portion of the gate spacer; and replacing the top portion by deposing a nitride material.

3. The method of claim 1, wherein removing said top portion of the gate spacer comprises performing an SiOC isotropic etch process.

4. The method of claim 1, wherein performing said metallization process to form said TS structure comprises: depositing a first metal liner in said TS structure void; depositing a Ti-nitride material in said TS structure void; and depositing a tungsten material in said structure void.

5. The method of claim 1, wherein forming said at least one M0 metal structure void comprises:
   depositing a dielectric layer;
   depositing a titanium-nitride (TiN) layer over said dielectric layer
   depositing a memorization layer over said TiN layer;
   depositing a first lithography stack above said memorization layer;
   patterning a first M0 metal structure;
   performing an etch process to transfer said first M0 structure into said memorization layer;
   removing said first lithography stack
   depositing a second lithography stack above said memorization layer;
   patterning a second M0 structure;
   performing an etch process to transfer said second M0 metal structure into said memorization layer; and
   removing said second lithography stack;
   performing at least one of an etch or punch process on said first and second M0 metal structures through the TiN layer to form a first M0 metal structure void and a second M0 metal structure void.

6. The method of claim 5, wherein performing said punch process comprises removing all materials within the patterned areas of said first and second M0 metal structures down to the dielectric layer.

7. The method of claim 1, wherein forming said at least one CB structure void comprises:
   depositing a dielectric layer;
   depositing an etch-stop layer over said dielectric layer;
   depositing a memorization layer over said etch-stop layer;
   depositing a first lithography stack above said memorization layer;
   patterning a first CB structure;
   performing a memorization process for said first CB structure into said memorization layer;
   removing said first lithography stack;
   depositing a second lithography stack above said memorization layer;
   patterning a second CB structure;
   performing a memorization process for said second CB structure into said memorization layer;

removing said second lithography stack; and
performing at least one of an etch or punch process on said first and second CB structures through the etch stop layer to form a first CB structure void and a second CB structure void.

8. The method of claim 7, wherein depositing said first and second lithography stacks each comprise depositing an organic planarization layer and depositing a photoresist layer above said organic planarization layer.

9. The method of claim 7, further comprising etching said CB and M0 structure voids down to said gate structure such that said CB and M0 structure voids are merged.

10. The method of claim 1, wherein forming said at least one CB structure comprises forming said at least one CB structure to self-align into said at least one M0 metal structure.

11. The method of claim 1, wherein forming at least one CA structure void comprises:
depositing a light-absorbing organic mix layer;
depositing a first lithography stack above said organic mix layer;
patterning a first CA structure;
removing said first lithography stack;
depositing a second lithography stack above said organic mix layer;
patterning a second CA structure;
removing said second lithography stack; and
performing a punch process on said first and second CA structures to form a first CA structure void and a second CA structure void.

12. The method of claim 11, further comprising:
depositing a memorization layer over said organic mix layer;
performing a memorization process for said first CA structure on said memorization layer; and
performing a memorization process for said second CA structure on said memorization layer.

13. The method of claim 1, further comprising providing a functional cell having cross coupled devices.

14. A method for forming a finFET device, comprising:
forming a gate structure comprising a gate spacer on a semiconductor wafer;
removing a top portion of the gate spacer;
replacing the top portion by deposing a nitride material;
forming a borderless trench silicide (TS) structure;
forming at least one first (M0) metal structure void;
forming at least one first contact (CB) structure void adjacent said M0 metal structure void;
etching below said M0 and CB structures voids to the gate structure such that said CB and M0 structure voids are merged;
forming at least one second contact (CA) structure void adjacent said CB structure void; and
performing metal filling in said M0, CB, and CA structure voids for forming a functional cell having cross couple.

15. The method of claim 14, further comprising performing a chemical mechanical polishing (CMP) process upon said nitride material to form a T-shaped self-aligned contact (SAC) cap over said gate structure.

16. The method of claim 14, wherein:
forming at least one CB structure void comprises performing CB double patterning process;
forming at least one M0 structure void comprises performing M0 double patterning process; and
forming at least one CA structure void comprises performing CA double patterning process.

17. A system, comprising:
a semiconductor device processing system to manufacture a semiconductor device comprising at least one fin field effect transistor (finFET); and
a processing controller operatively coupled to said semiconductor device processing system, said processing controller configured to control an operation of said semiconductor device processing system;
wherein said semiconductor device processing system is adapted to:
form a gate structure comprising a gate spacer on a semiconductor wafer;
form a self-aligned contact (SAC) cap over said gate structure;
form a TS structure;
form at least one M0 metal structure void;
form at least one CB structure void adjacent said M0 metal structure void;
etch below said M0 and CB structures voids to the gate structure;
form at least one CA structure void adjacent said CB structure void; and
perform metal filling in said M0, CB, and CA structure voids;
wherein said semiconductor device processing system is adapted to form said TS structure by:
depositing a lithography stack in the location for said TS structure;
performing an etch process for removing an SiO2 oxide portion and exposing a sidewall of said gate structure;
removing said lithography stack;
depositing an SiOC material on said location for said TS structure;
performing a CMP process over said SiOC material;
performing an etch process for removing $SiO_2$ material selective to said SiOC material;
performing an etch process on said location for said TS structure for forming a TS structure void;
removing sidewall and bottom material from said TS structure void; and performing a metallization process to form said TS structure.

18. The system of claim 17, further comprising a design unit configured to generate a first design comprising a definition for a functional cell having cross couple, wherein data from said design unit is used by said process controller to control an operation of said semiconductor device processing system.

19. The system of claim 17, wherein said semiconductor device processing system is further adapted to process semiconductor wafers to form functional cells characterized by a 10 nm architecture having 31.5 nm fin pitch in a 7.5 nm track design at 42 nm metal pitch for processing cross couple.

* * * * *